United States Patent [19]

Ishioka et al.

[11] 4,419,604
[45] Dec. 6, 1983

[54] LIGHT SENSITIVE SCREEN

[75] Inventors: Sachio Ishioka, Tokyo; Yoshinori Imamura, Hachioji; Yasuharu Shimomoto; Saburo Ataka, both of Hinodemachi; Yasuo Tanaka, Kokubunji; Eiichi Maruyama, Kodaira, all of Japan

[73] Assignee: Hitachi, Ltd., Tokyo, Japan

[21] Appl. No.: 257,611

[22] Filed: Apr. 24, 1981

[30] Foreign Application Priority Data

Apr. 25, 1980 [JP] Japan .................... 55-54155

[51] Int. Cl.$^3$ .............................. H01J 29/45
[52] U.S. Cl. ........................ 313/385; 252/501.1; 313/386; 313/388; 357/31
[58] Field of Search .............. 313/385, 386, 388, 94; 252/501.1; 357/31

[56] References Cited

U.S. PATENT DOCUMENTS

| | | | |
|---|---|---|---|
| 3,890,524 | 6/1975 | Watanabe | 313/94 |
| 4,128,844 | 12/1978 | Illenberger | 357/31 |
| 4,147,667 | 4/1979 | Chevallier | 252/501 |
| 4,255,686 | 3/1981 | Maruyama et al. | 313/366 |
| 4,360,821 | 11/1982 | Tsukada et al. | 357/31 |

FOREIGN PATENT DOCUMENTS

| | | |
|---|---|---|
| 1166982 | 10/1969 | United Kingdom . |
| 1349351 | 4/1974 | United Kingdom . |
| 1460339 | 1/1977 | United Kingdom . |
| 1483499 | 8/1977 | United Kingdom . |

Primary Examiner—Eugene R. LaRoche
Attorney, Agent, or Firm—Antonelli, Terry & Wands

[57] ABSTRACT

Disclosed is a light sensitive screen including at least a light-transmitting conductive film and a photoconductive layer, the light-transmitting conductive film being arranged on a side of incidence of light, characterized in that the photoconductive layer is constructed of a single layer or a plurality of layers of one or more photoconductive substances, at least one of such photoconductive substance layers being formed of an amorphous silicon material which contains at least 5 atomic-% to 30 atomic-% of hydrogen, whose optical forbidden band gap is 1.65 eV to 2.25 eV and whose peak component in an infrared absorption spectrum at a wave number of 2,100 cm$^{-1}$ is greater than that at a wave number of 2,000 cm$^{-1}$. Various characteristics of an imaging device provided with the light sensitive screen, such as dark current, lag and after image characteristics, are improved.

17 Claims, 13 Drawing Figures

LIGHT SENSITIVE SCREEN

BACKGROUND OF THE INVENTION

1. Field of the Invention

This invention relates to a light sensitive screen which employs as its photoelectric material an amorphous silicon film containing hydrogen.

The light sensitive screen is especially useful when applied to a photosensor which is operated in the storage mode, for example, a target for a photoconductive type image pickup tube or a solid-state imaging device.

2. Description of the Prior Art

Amorphous silicon containing hydrogen exhibits a photoconductivity and can form a thin film of large area at a comparatively low temperature, so that applications to the light sensitive screens of a solar cell, an imaging device etc. have been proposed. As a typical example of a photosensor which is operated in the storage mode, there is a photoconductive type image pickup tube.

It has been proposed and previously applied for a patent (U.S. Pat. No. 4,255,686) to use as the photoconductive layer of such image pickup tube an amorphous material whose principal constituent is silicon and which contains hydrogen.

A patent application (Ser. No. 066,230, HITACHI) has also been previously filed as to the application of the hydrogen-containing amorphous silicon to a solid-state imaging device which employs a photoconductor.

The hydrogen-containing amorphous silicon can readily provide a high resistivity. This is an advantage which is not inherent in materials having heretofore been used for light sensitive screens, for example, $Sb_2S_3$—, PbO— and Se-based chalcogenide glasses. The advantage signifies that a charge pattern stored on the side of a light sensitive screen as is scanned by an electron beam does not decay within a storage time (the period of time which is taken for a specified picture element to be scanned by the scanning electron beam).

This invention further intends to improve various characteristics as imaging devices.

The following publications indicate the prior arts of this invention:

(1) Great Britain Pat. No. 1,349,351
(2) U.S. Pat. No. 4,147,667

SUMMARY OF THE INVENTION

This invention provides a light sensitive screen which has extraordinarily excellent characteristics as a light sensitive screen for an imaging device.

The light sensitive screen of this invention is characterized in that a hydrogen-containing amorphous silicon film as stated below is employed as a photoconductive film.

(1) Hydrogen is contained at a content of at least 5 atomic-%–30 atomic-%.

(2) The optical forbidden band gap has a value of at least 1.65 eV and at most 2.25 eV, more preferably 1.85 eV–2.10 eV.

(3) In the observation of infrared absorption peaks, a component corresponding to a wave number of 2,100 $cm^{-1}$ is observed greater than a component corresponding to a wave number of 2,000 $cm^{-1}$.

When the component at the wave number of 2,000 $cm^{-1}$ is not greater than 80% of that at the wave number of 2,100 $cm^{-1}$, favorable characteristics are presented. It is more preferable that the former component is not greater than 50% of the latter component, and it is especially preferable that the former component is not greater than 25% of the latter component.

It is important that the hydrogen content of the amorphous silicon according to this invention is 5 atomic-%–30 atomic-% as stated above. More preferably, the hydrogen content is 7 atomic-%–20 atomic-%. In case where the hydrogen content is too low or where it is too high conversely, photoconductivity characteristics degrade sharply.

Further, the amorphous silicon according to this invention needs to have the optical forbidden band gap of 1.65 eV–2.25 eV, more preferably 1.85 eV–2.10 eV.

As compared with hitherto-known light sensitive screens which employ hydrogen-containing amorphous silicon as their photoelectric material, the light sensitive screen of this invention is excellent in various characteristics as mentioned below. All these characteristics are important as imaging devices.

(1) dark current characteristics
(2) lag characteristics
(3) after image characteristics
(4) resolution Concrete comparisons concerning these characteristics will be made later.

DETAILED DESCRIPTION OF THE INVENTION

The optical forbidden band gap of amorphous silicon depends upon the composition and structure of the material, especially upon the hydrogen content thereof. Even at an identical hydrogen content, however, the optical forbidden band gap assumes two states. Examples are listed in Table 1.

TABLE 1

| No. | Hydrogen content (atomic-%) | Optical forbidden band gap (eV) | |
|---|---|---|---|
| | | First state | Second state (this invention) |
| 1 | 5 | 1.3 | 2.3 |
| 2 | 10 | 1.45 | 2.0 |
| 3 | 15 | 1.55 | 1.95 |
| 4 | 20 | 1.60 | 1.90 |

The reason why such two states develop has not been fully elucidated.

Figure 1:
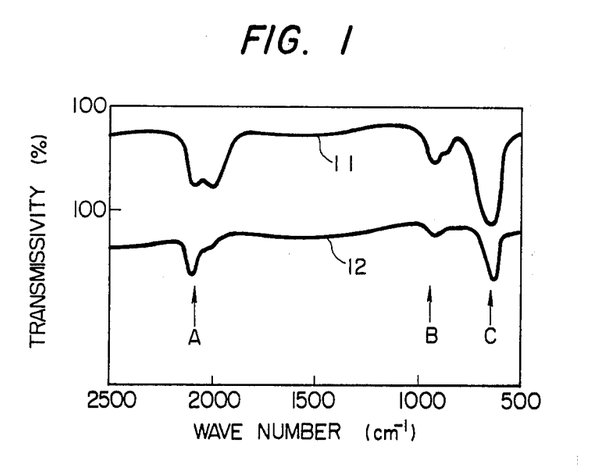
FIG. 1 is a graph showing the infrared absorption spectral curves of hydrogen-containing amorphous silicon.

FIG. 1 shows the infrared absorption spectral curves of hydrogen-containing amorphous silicon. The peaks of an infrared absorption spectrum which are observed include (1) one caused by the stretching vibration mode of the coupling between hydrogen and silicon, (2) one caused by the bending vibration mode thereof, and (3) one caused by the wagging or rocking vibration mode thereof. In FIG. 1, the respective peaks correspond to peaks at positions A, B and C. Further, the stretching vibration mode affords divided peaks in the vicinity of a wave number of 2,000 cm$^{-1}$ and in the vicinity of a wave number of 2,100 cm$^{-1}$. The curve 11 shows an example in which both the peaks have approximately equal magnitudes, while the curve 12 shows an example in which the peak at 2,100 cm$^{-1}$ is greater than the peak at 2,000 cm$^{-1}$.

These peaks correspond to different hydrogen-silicon coupling states. In this regard, the hydrogen-containing amorphous silicon in which the component at the wave number of 2,100 cm$^{-1}$ is observed greater than the component at the number number of 2,000 cm$^{-1}$ is very favorable for imaging devices.

Table 2 lists measured results of the conditions of the infrared absorption peaks and the various characteristics of imaging devices.

TABLE 2

| (peak) 2,000/ (peak) 2,100 | at least 1 (one) | 0.8 | 0.5 | 0.25 |
|---|---|---|---|---|
| photocurrent (nA) (10 1X illumination) | 800 | 600 | 800 | 900 |
| dark current (nA) | 100 | 10 | 3 | 1 |
| lag (%, after 50 sec.) | 80 | 20 | 15 | 10 |
| after image | above 1 min. | 15 sec. | below 1 sec. | below 1 sec. |
| thickness of film (μm) | 2 | 2 | 2 | 2 |
| hydrogen content (atomic-%) | 7 | 20 | 15 | 10 |
| optical forbiddent band gap (eV) | 1.6 | 1.85 | 1.9 | 2.1 |
| | compara- tive ex. | | | |

Although the reason why such differences in the characteristics arise has not been fully elucidated theoretically, the following is conjectured for the time being.

In the amorphous silicon, hydrogen couples with the dangling bonds of silicon and functions to reduce localized states in a forbidden band gap. The difference of the coupling states will result in different conditions of the localized states, and this will be the factor.

In addition, for use in the imaging devices, preferably the photoconductive layer has a resistivity of at least $10^{10}\Omega\cdot$cm lest a charge pattern should diffuse and disappear within a storage time. The photoconductive material of the present invention meets also this requirement satisfactorily.

A typical process for manufacturing the hydrogen-containing silicon according to this invention is the reactive sputtering of silicon in an atmosphere which contains hydrogen. To the end of obtaining a high-resistivity sample, a method is especially preferable which is based on the reactive sputtering of a silicon alloy in a mixed atmosphere consisting of hydrogen and a rare gas such as argon.

Figure 2:
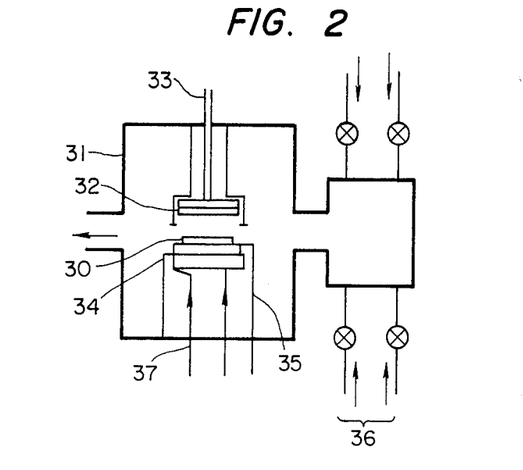
FIG. 2 is an explanatory view of a sputtering equipment.

FIG. 2 shows an example in the case of adopting the sputtering process. Numeral 30 designates a sample, numeral 31 a vessel which can be evacuated to vacuum, and numeral 32 a sputtering target for which a sintered compact of silicon or the like is used. Numeral 33 indicates an electrode to which an r.f. voltage is applied, numeral 34 a sample holder, numeral 35 a thermocouple for measuring a temperature, numeral 36 gas inlets for the rare gas such as argon and hydrogen etc., and numeral 37 a passage of cooling water.

Suitable as a sputtering equipment is a low-temperature and high-speed sputtering equipment of the magnetron type. Usually, when heated to or above 350° C., an amorphous film containing hydrogen and silicon emits the hydrogen and changes in quality. Therefore, the substrate temperature during the formation of the film should desirably be held at 100° C.–300° C., especially preferably at 200° C.–250° C. The pressure of the atmosphere during the sputtering discharge reaction is set at $5 \times 10^{-4}$ Torr–$1 \times 10^{-2}$ Torr. The partial pressure of hydrogen is set at 20% or above, desirably 40% or above.

The hydrogen content of the amorphous silicon depends upon the partial pressure of hydrogen in the atmosphere, and it is desired that at least $1 \times 10^{-3}$ Torr of hydrogen exists.

Further, in performing this invention, scrupulous care must be taken of impure gases in the atmosphere during the sputtering as follows.

Among the impurities in the atmosphere gas within the sputtering equipment, oxygen is made at most $5 \times 10^{-5}$ Torr, nitrogen at most $1 \times 10^{-5}$ Torr, and water at most $1 \times 10^{-5}$ Torr. Particularly the mixed existence of oxygen and water is an obstacle to the formation of the hydrogen-containing amorphous silicon peculiar to this invention.

The sputtering input may be either direct-current (D.C.) discharge or radio-frequency discharge. In case of the D.C. discharge, the power density is set at 0.6–6.0 W/cm$^2$, and in order to attain sufficient power, it is recommended to adjust the input power to 100 W–1 kW and the voltage to 0.8–1.5 kV. In case of the radio-frequency discharge, the frequency is usually set at 0.2–30 MHz, and the power density is usually set at 0.6–6.0 W/cm$^2$, desirably 1.0–3.0 W/cm$^2$. In order to attain sufficient power, it is recommended to adjust the voltage to 0.8–1.5 kV. In case of the magnetron type radio-frequency discharge, the power density is set at 0.6–6.0 W/cm$^2$, desirably 1.0–3.0 W/cm$^2$, and the voltage is generally adjusted to 0.2–0.5 kV in order to attain sufficient power.

The growth rate of the amorphous silicon film is usually set at 0.5–80 Å/sec., desirably 1–20 Å/sec.

The thickness of the photoconductive layer of the light sensitive screen of this invention is ordinarily made approximately 0.1 μm–50 μm. In case of the imaging devices, the thickness is preferably made approximately 1–10 μm.

Figure 3:
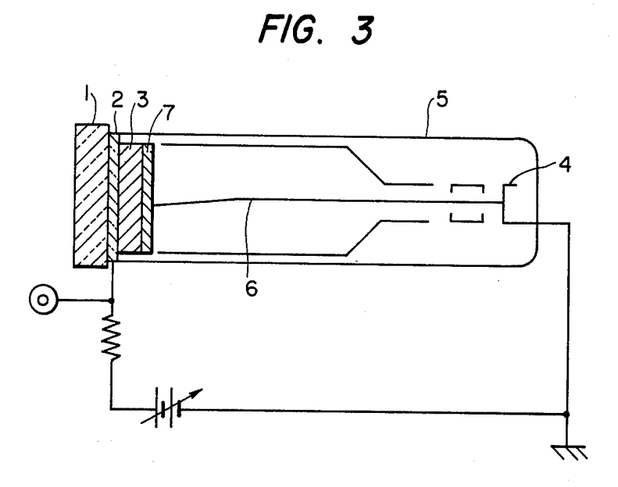
FIG. 3 is a schematic sectional view of a photoconductive type image pickup tube.

A typical example of the photosensor which is used in the storage mode is the photoconductive type image pickup tube. FIG. 3 shows a sectional view of the device for explaining the principle thereof. The device consists of a light-transmitting substrate 1 usually called "faceplate", a transparent conductive film 2, a photoconductive layer 3, an electron gun 4, and an envelope 5. An optical image focused on the photoconductive layer 3 through the faceplate 1 is photoelectrically converted and is stored as a charge pattern in the surface of the photoconductive layer 3. The charge pattern is read in time sequence by a scanning electron beam 6.

In general, a beam landing layer 7 is disposed on the surface of the photoconductive layer 3 for such purposes as preventing the inversion and checking the injection of electrons from the scanning electron beam.

Figure 4:
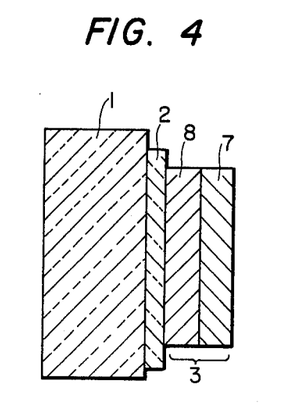
FIGS. 4 to 10 are sectional views of targets for image pickup tubes.

The photoconductive layer of the light sensitive screen may well be formed of a plurality of layers. FIG. 4 is a sectional view showing such an example. Numeral 1 designates a light-transmitting substrate, numeral 2 a transparent electrode, and numerals 7 and 8 respective photoconductive films which constitute a photoconductive layer 3. In this case, the photoconductive film 8 should preferably be made of hydrogen-containing amorphous silicon having the following properties. This is because the bonding between the substrate 1 and the photoconductive layer 3 is enhanced.

As the characteristics of the hydrogen-containing amorphous silicon, (1) hydrogen is contained at a content of at least 5 atomic-%–30 atomic-%, and (2) in the observation of infrared absorption peaks, the component corresponding to a wave number of 2,100 cm$^{-1}$ is observed to be smaller than the component corresponding to a wave number of 2,000 cm$^{-1}$. (3) The thickness of the film 8 is 0.01 $\mu$m–30 $\mu$m, preferably 0.05–1 $\mu$m.

Figure 5:
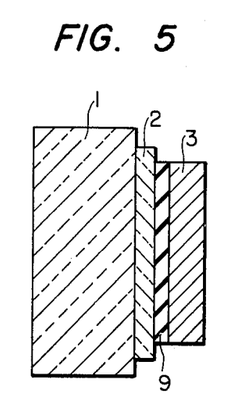
Figure 6:
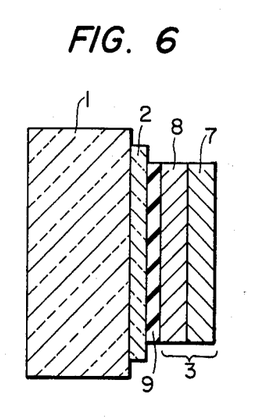

As the transparent conductive film 2, a low-resistivity oxide film of $SnO_2$, $In_2O_3$, $TiO_2$ or the like or a semi-transparent metal film of Al, Au or the like can be usually employed. In order to reduce the dark current of the photosensor and to raise the response rate, it is desirable to form a rectifying contact between the transparent conductive film 2 and the photoconductive layer 3. Further, the injection of holes from the transparent conductive film 2 into the photoconductive layer 3 can be suppressed by interposing a thin, hole blocking layer between the photoconductive layer 3 and the transparent conductive film 2. Thus, a good rectifying contact is attained. In this case, in order to use the contact as a photodiode, it is desirable to make the transparent conductive film side an anode and the amorphous layer side a cathode. FIG. 5 shows an example of a photosensor having such structure. A hole blocking layer 9 is interposed between the transparent conductive film 2 and the amorphous photoconductor layer 3. Also FIG. 6 is a sectional view showing an example of a photosensor which has a hole blocking layer. This example is the same as the example of FIG. 5 except that the photoconductive layer 3 has the laminated structure consisting of layers 7 and 8. Usually, a photoconductor which has a sensitivity to the visible region is a semiconductor whose forbidden band gap is 2.0 eV or so. In this case, accordingly, the hole blocking layer 9 is desired to have a forbidden band gap of at least 2.0 eV so as not to hinder the arrival of light at the photoconductive layer 3. As materials suited to this use, the following are preferable:

(1) Oxide:

Oxide of at least one element selected from the group consisting of Si, Ti, Al, Mg, Ba, Ta, W, Bi, V, Ge, Ni, Th, Mo, Fe, La, Be, Sc and Co.

Concrete examples are as follows: $SiO_2$, $TiO_2$, $Al_2O_3$, MgO, BaO, $Ta_2O_5$, $WO_3$, $Bi_2O_3$, $V_2O_5$, GeO, NiO, $ThO_2$, $Fe_2O_3$, $La_2O_3$, $MoO_3$, BeO, $Sc_2O_3$, $Co_2O_3$, and eutectics.

(2) Nitride:

Nitride of at least one element selected from the group consisting of Ga, Si, Mg, Ta, Hf, Zr, Nb and B.

Concrete examples are as follows: GaN, $Si_3N_4$, $Si_2N_3$, $MgN_2$, TaN, HfN, ZrN, NbN, BN, and eutectics.

(3) Halide:

Halide of at least one element selected from the group consisting of Na, Mg, Li, Ba, Ca and K. Concrete examples are MgF, LiF, NaF, $BaF_2$, $CaF_2$, KF, and eutectics.

In addition, a layer of a mixture consisting of the above-mentioned materials or stacked layers of the above-mentioned materials can be employed.

The thickness of the layer is made 50 Å–5,000 Å or so. Especially, at a thickness of 1,000 Å or less, the transmission factor of the incident light decreases little, and the lowering of the sensitivity of the photoelectric device need not be feared.

Ordinarily, it is very favorable that the oxide layer stated above is formed by the sputtering evaporation process by the use of the same oxide for an evaporation source material.

The sputtering evaporation usually resorts to radio-frequency discharge in Ar gas under a pressure of $1 \times 10^{-1}$ Torr to $1 \times 10^{-3}$ Torr. At this time, in case where the oxide is liable to blacken due to reduction, at most approximately 5 volume-% of oxygen may be mixed into the Ar gas.

The temperature of the substrate during the evaporation may be 25° C.–400° C., but a value of 100° C.–250° C. is favorable for forming a film which lies in close contact with the substrate and which has a good flatness.

The thin layer of any of the above-mentioned oxides, nitrides and halides intervenes between the photoconductive film and the signal electrode. However, the thin layer need not always adjoin the signal electrode, but a layer made of another material may intervene between the signal electrode and the thin layer. It is required, however, that the photoconductive film and the oxide adjoin each other.

The hole blocking layer can be used, not only for the light sensitive screen of the image pickup tube described before, but also for those of solid-state imaging devices for similar purposes.

Figure 7:
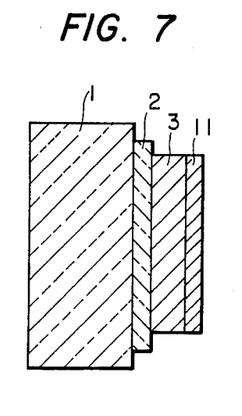
Figure 8:
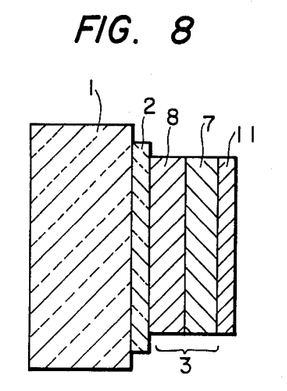
Figure 9:
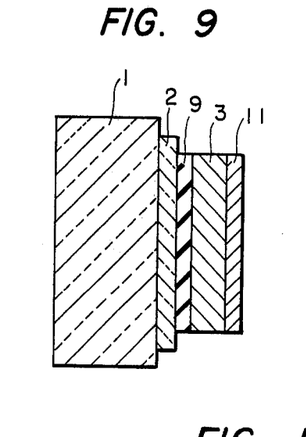
Figure 10:
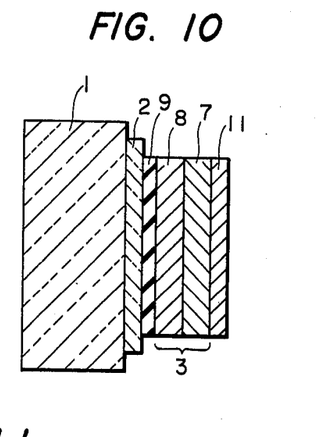

In case of employing the photoconductive layer of this invention as the target of the image pickup tube, it is desirable that a beam landing layer such as antimony trisulfide layer is further stacked on the surface of the photoconductive layer 3 so as to prevent the injection of electrons from the scanning electron beam 6 or to suppress the generation of secondary electrons from the photoconductive layer 3. To this end, the antimony trisulfide film is evaporated in argon gas under a low pressure of $1 \times 10^{-3}$ Torr to $1 \times 10^{-2}$ Torr, and the thickness of the film may satisfactorily lie in a range of from 10 nm to 1 $\mu$m. FIG. 7 is a sectional view showing an example of this structure. A light-transmitting substrate 1 is overlaid with a transparent conductive film 2 and a photoconductive film 3, on which an antimony trisulfide film 11 is further formed. Also FIGS. 8 to 10 are sectional views each showing an example in which the antimony trisulfide film 11 is formed on the photoconductive film 3. Herein, FIG. 8 shows an example in which the photoconductive film 3 has a laminated structure consisting of layers 7 and 8, and FIGS. 9 and 10 show examples in which the measure is applied to the structure having the hole blocking layer disposed between the photoconductive film 3 and the transparent electrode.

Although, as to the photoconductive layer 3, only the example of the single layer and the example of the two layers of the layers 7 and 8 have been thus far described, a photoconductive layer consisting of more layers may well be constructed.

It is also allowed to vary the composition continuously.

The constructions of the various light sensitive screens thus far described may be selected according to purposes.

EXAMPLE 1

Both the surfaces of a glass substrate having a diameter of 1 inch were optically polished, and a transparent electrode of, for example, tin oxide ($SnO_2$) was disposed on one surface of the glass substrate to a thickness of 300 nm. Subsequently, a sintered compact of silicon at a purity of 99.999% was installed as a target on a radio-frequency sputtering equipment. The glass substrate stated above was mounted in the sputtering equipment so that the target and the transparent electrode might face each other.

At the next step, a vacuum vessel of the radio-frequency sputtering equipment was evacuated to a high vacuum of approximately $5 \times 10^{-6}$ Torr, whereupon a mixed gas consisting of hydrogen and argon was introduced thereinto up to a pressure of $10^{-2}$–$10^{-3}$ Torr.

While the temperature of the substrate was held at approximately 200° C., a radio-frequency power of approximately 300 W (at 13.56 MHz) was applied to the target at a power density of 2 $W/cm^2$. In this case, a residual gas at sputtering had the following components:

oxygen: $1 \times 10^{-5}$ Torr
nitrogen: $1 \times 10^{-5}$ Torr
water: $5 \times 10^{-6}$ Torr Discharge was established across the target and the substrate, and hydrogen-containing amorphous silicon was deposited on the glass substrate. Table 3 lists samples manufactured and the main properties and manufacturing conditions thereof.

TABLE 3

| No. | Hydrogen content (atomic-%) | Optical forbidden band gap (eV) | (peak) 2,000/ (peak) 2,100 | Remarks | Gaseous pressure (Torr) | Partial pressure of hydrogen (Torr) | Substrate temperature (°C.) | Lag (%) | After image |
|---|---|---|---|---|---|---|---|---|---|
| 1 | 1 | 1.1 | 3.0 | Comparative ex. | $5 \times 10^{-3}$ | $1 \times 10^{-5}$ | 250° C. | 30 | above 1 min. |
| 2 | 5 | 2.3 | 1.0 | | " | $2 \times 10^{-4}$ | " | 14 | below 15 sec. |
| 3 | 7 | 2.32 | 0.8 | | " | $4 \times 10^{-4}$ | " | 11 | below 1 sec. |
| 4 | 10 | 2.0 | 0.3 | | " | $5 \times 10^{-4}$ | " | 10 | below 1 sec. |
| 5 | 15 | 1.95 | 0.2 | | " | $3 \times 10^{-3}$ | " | 10 | below 1 sec. |
| 6 | 20 | 1.90 | 0.1 | | " | $2 \times 10^{-3}$ | " | 10 | below 1 sec. |
| 7 | 25 | 1.80 | 0.1 | | " | $1 \times 10^{-3}$ | 100° C. | 14 | below 15 sec. |
| 8 | 30 | 1.70 | 0.1 | | " | $1 \times 10^{-3}$ | 100° C. | 18 | below 15 sec. |

On each of the samples as stated above, antimony trisulfide was evaporated and formed as a beam landing layer to a thickness of 100 nm. The evaporation of the antimony trisulfide was carried out in argon gas under $1 \times 10^{-3}$ Torr.

The light sensitive screen thus fabricated (for example, sample No. 6 in Table 3) was assembled into a vidicon type image pickup tube, and characteristics were measured. Under illumination of white light of 10 lx, favorable characteristics of a photo signal current of 900 A and a dark current of below 1 nA were obtained under the condition of an applied voltage of 30 V. Also the other light sensitive screens were sufficiently useful as imaging devices.

EXAMPLE 2

As shown in FIG. 9, a transparent electrode 2 made of $SnO_2$ was formed on a glass substrate 1. The resultant substrate was installed on a substrate holder electrode in a radio-frequency sputtering equipment. On the other hand, an $SiO_2$ target was installed on a target electrode. Subsequently, a sputtering chamber was evacuated to a pressure of below $5 \times 10^{-6}$ Torr, whereupon Ar gas was introduced thereinto so as to establish a gaseous pressure of $5 \times 10^{-3}$ Torr.

Radio-frequency discharge at an output of 1.5 $W/cm^2$ at 13.56 MHz was conducted across both the electrodes under the aforecited gaseous pressure, to form an $SiO_2$ thin film 9 as a hole blocking layer on the transparent electrode 2 to a thickness of approximately 250 Å.

Subsequently, a sintered compact of silicon at 99.999% was mounted on the target electrode of the radio-frequency sputtering equipment. In a mixed atmosphere consisting of $1 \times 10^{-3}$ Torr of Ar and $2 \times 10^{-3}$ Torr of hydrogen, an amorphous silicon film 3 was formed on the $SiO_2$ thin film 9 by the reactive sputtering. At this time, the partial pressures of the remaining gases were the same as in Example 1. In this case, the substrate was held at 200° C. The amorphous silicon film thus formed contained approximately 10 atomic-% of hydrogen, and had a resistivity of $10^{14}$ Ω.cm.

The optical forbidden band gap of the amorphous silicon film was 2.0 eV, and the ratio between the peaks of an infrared absorption spectrum, i.e., (peak) 2,000/(peak) 2,100 was 0.2.

The $SiO_2$ thin film 9 can be formed by the electron-beam evaporation besides by the sputtering process described above. An $SiO_2$ film formed by the electron-beam evaporation exhibits a dark current suppressing effect approximately equal to that of the film formed by the sputtering process. In general, however, the evaporated film is lower than the sputtered film in the strength of bonding with the substrate, and it can exfoliate from the substrate when the amorphous silicon is deposited thereon.

Lastly, as a beam landing layer for improving the landing characteristics of an electron beam, an $Sb_2S_3$ film 11 was evaporated in an Ar gas pressure to a thickness of approximately 1,000 Å.

With the pickup tube target fabricated by the above method, the dark current was suppressed to be sufficiently low even at a high target voltage.

As regards the hole blocking layer, the various materials previously mentioned were studied. Principal materials are summed up as Table 4. In the table, they are assorted into three classes in accordance with their effects on the dark current.

TABLE 4

| | Characteristics Dark current (target voltage $V_T = 50$ V) (relative value) | | |
|---|---|---|---|
| Material | 1 | 1–2 | 2–10 |
| Oxide | $SiO_2$, BaO, $Ta_2O_5$, $TiO_2$, $Al_2O_3$ | MgO, $WO_3$, $V_2O_5$, NiO, $Fe_2O_3$, $MoO_3$, $CoO_3$ | $Bi_2O_3$, GeO, $ThO_2$, $La_2O_3$, BeO, $ScO_3$ |
| Nitride | $Si_3N_4$, TaN | GaN, $Si_2N_3$, $MgN_2$ | HfN, ZrN, NbN, BN |

TABLE 4-continued

| | Characteristics Dark current (target voltage $V_T = 50$ V) (relative value) | |
|---|---|---|
| Material | 1—2 | 2—10 |
| Halide | LiF, MgF$_2$ | BaF$_2$, CaF$_2$, NaF, KF |

Especially, SiO$_2$, BaO, TiO$_2$, Ta$_2$O$_5$ and Al$_2$O$_3$ among oxides, Si$_3$N$_4$ and TaN among nitrides and LiF and MgF$_2$ among halides exhibit extraordinarily excellent characteristics. Exhibitive of better characteristics are MgO, WO$_3$, V$_2$O$_5$, NiO, Fe$_2$O$_3$, MoO$_3$ and Co$_2$O$_3$ among oxides, GaN, Si$_2$N$_3$ and MgN$_2$ among nitrides and BaF$_2$, CaF$_2$, NaF and KF among halides.

EXAMPLE 3

This example will be described with reference to FIG. 10.

A transparent electrode 2 made of SnO$_2$ was formed on a glass substrate 1, and the resultant substrate was installed in a radio-frequency sputtering equipment. On the other hand, an SiO$_2$ target was installed on a target electrode. Subsequently, a sputtering chamber was evacuated to a pressure of below $5 \times 10^{-6}$ Torr, whereupon Ar gas was introduced thereinto so as to establish a gaseous pressure of $1.0 \times 10^{-2}$ Torr.

Radio-frequency discharge at a frequency of 13.56 MHz and an output of 1 W/cm$^2$ was conducted across both the electrodes, to form an SiO$_2$ thin film as a hole blocking layer 9 on the transparent electrode 2 to a thickness of approximately 250 Å.

Subsequently, a sintered compact of silicon at 99.999% was mounted on the target electrode of the radio-frequency sputtering equipment. Using the reactive sputtering, an amorphous silicon film 8 was formed in a mixed atmosphere consisting of $1 \times 10^{-3}$ Torr of argon and $2 \times 10^{-4}$ Torr of hydrogen, and an amorphous silicon film 7 in a mixed atmosphere consisting of $1 \times 10^{-3}$ Torr of argon and $2 \times 10^{-3}$ Torr of hydrogen. Residual gas components at the formation of the amorphous silicon film 7 were approximately the same as in Example 1.

The properties of the amorphous silicon films 7 and 8 were as follows. The hydrogen content of the film 8 was 5 atomic-%, the optical band gap was 1.7 eV, and the (peak) 2,000/(peak) 2,100 = 2.0. The hydrogen content of the film 7 was 15 atomic-%, the optical band gap was 2.0 eV, and the (peak) 2,000/(peak) 2,100 = 0.5.

Further, an antimony trisulfide layer 11 was formed on the photoconductive layer 3, to finish up a target of a vidicon type image pickup tube.

When the film 8 existed in this manner, surface defects ascribable to the film exfoliation decreased, and a picture in which no flaw was noted was obtained at an applied voltage of 30 V.

EXAMPLE 4

This embodiment is an example in which the present invention is applied to the light sensitive screen of a solid-state imaging device.

Figure 11:
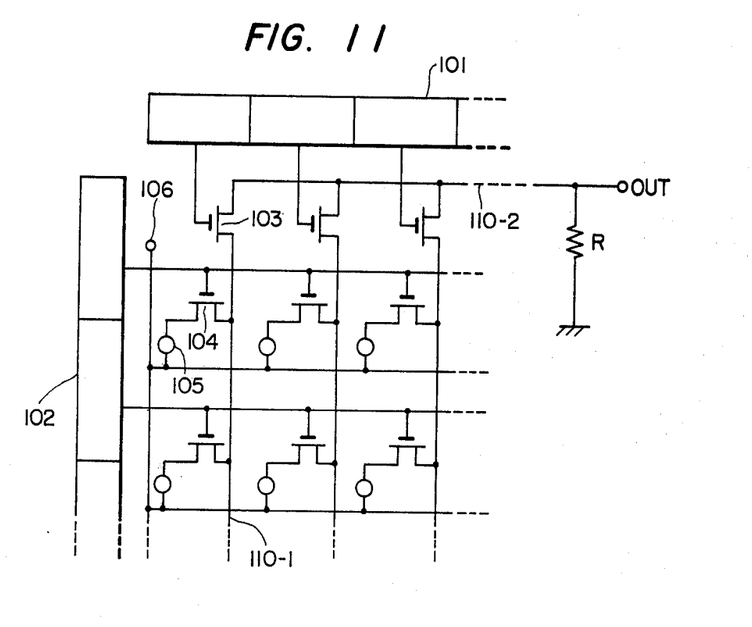
FIG. 11 is a diagram for explaining the principle of a solid-state imaging device.
Figure 12:
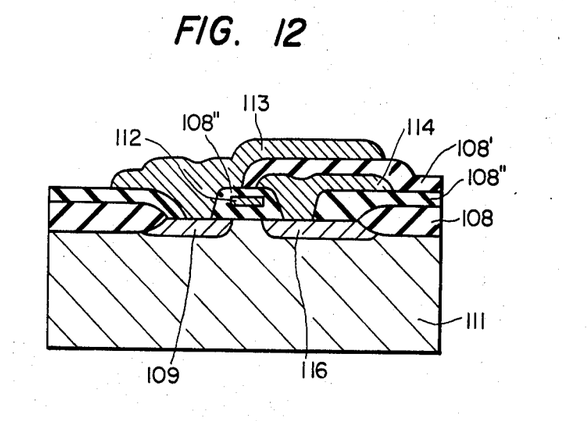
FIGS. 12 and 13 are sectional views of a solid-state imaging device showing manufacturing steps thereof.
Figure 13:
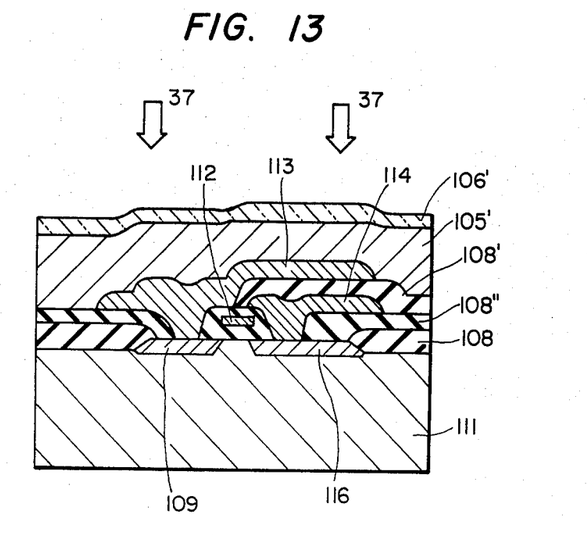

As an example of the solid-state imaging device, there is one in which only scanning circuits and groups of switches connected therewith are arrayed on a semiconductor substrate and are overlaid with a photoconductive thin film for the function of photoelectric conversion. Owing to the double-layer structure in which photoelectric elements are formed on the scanning circuits as well as the groups of switches, the density of integration of picture elements (in other words, resolution) and the light receiving efficiency become higher. Therefore, this device is expected as a solid-state imaging device in the future. An example of the solid-state imaging device of this type is disclosed in Japanese Laid-open Patent Application No. 51-10715 (filed July 5, 1974). FIG. 11 shows a construction for explaining the principle of the device. Referring to the figure, numeral 101 designates a horizontal scanning circuit which turns "on" and "off" horizontal addressing switches 103, numeral 102 a vertical scanning circuit which turns "on" and "off" vertical addressing switches 104, numeral 105 a photoelectric element which utilizes a photoconductive thin film, numeral 106 a supply voltage terminal for driving the photoelectric elements 105, symbols 110-1 and 110-2 signal output lines, and letter R a resistor. FIGS. 12 and 13 show the sectional structure of a photoelectric region in FIG. 11 in the order of manufacturing steps. Numeral 105' indicates the photoconductive thin film, numeral 106' transparent electrode and numerals 108, 108' and 108" insulating films. Numeral 111 indicates a semiconductor substrate, numeral 112 a gate electrode, and numeral 113 an electrode (of, for example, Al) which is in ohmic contact with one end 109 (diffused region formed from an impurity of a conductivity type opposite to that of the substrate 111) of the switch (indicated by numeral 104 in FIG. 11). When an optical image is focused on the photoconductive thin film through a lens, the resistance of the photoconductive film varies according to the light intensity of the optical image. A voltage variation corresponding to the optical image appears at the end 109 of the vertical switch (indicated by numeral 104 in FIG. 11), and the variation is taken out as a video signal from an output terminal OUT through the signal output lines 110-1 and 110-2 (shown in FIG. 11). Shown at numeral 116 is an impurity-diffused region which has the same conductivity type as that of the region 109 and which is connected to the signal output line 110-1.

Since the fundamental structure of the present example is as shown in FIG. 13, it will be described with reference thereto. The scanning circuit portion including the switching circuits to be formed on the semiconductor substrate was produced by the use of conventional manufacturing steps of semiconductor devices. A thin SiO$_2$ film of approximately 800 Å was formed on the p-type silicon substrate 111, and an Si$_3$N$_4$ film of approximately 1,400 Å was formed on a predetermined position of the SiO$_2$ film. The formation of the SiO$_2$ film was relied on the conventional CVD process, and that of the SiN$_4$ film on the CVD process in which Si$_3$N$_4$ and N$_2$ were caused to flow. Subsequently, the silicon was locally oxidized in an atmosphere of H$_2$:O$_2$ = 1:8, to form the SiO$_2$ layer 108. This method is the local oxidation of silicon for isolating elements as is usually termed "LOCOS". The Si$_3$N$_4$ film and the SiO$_2$ film were once removed, and the gate insulating film of a MOS transistor was formed of an SiO$_2$ film.

At the next step, the gate portion 112 of polycrystalline silicon and the diffused regions 109 and 116 were formed, and an SiO$_2$ film was further formed thereon. In this film, an electrode lead-out opening for the impurity region 116 was provided by etching. As the electrode 110-1, Al was evaporated 8,000 Å. Further, an SiO$_2$ film 108' was formed to be 7,500 Å thick. Subsequently, on the impurity region 109, an electrode lead-out opening therefor was provided by etching. As the electrode 113, Al or Mo was evaporated 1 μm. The electrode 113 was formed in a manner to cover the regions 109 and 116 and the gate portion. The reason for this measure is that the incidence of light on the signal processing region between the elements becomes a cause for blooming undesirably.

It is optional to dispose a recombination layer of $Sb_2S_3$ or the like on the aluminum electrode 113.

The manufacture of the foregoing semiconductor device portion can be satisfactorily made with the manufacturing process of the conventional MOS type integrated circuit.

Subsequently, the semiconductor body prepared by the steps thus far described was installed on a magnetron type sputtering equipment. The atmosphere was a mixed gas consisting of Ar and hydrogen and being under $5 \times 10^{-3}$ Torr. The hydrogen content was 60 pressure-%. The sputtering target was of silicon. The residual gas at the sputtering consisted of $1 \times 10^{-5}$ Torr of oxygen, $1 \times 10^{-5}$ Torr of nitrogen, and $5 \times 10^{-6}$ Torr of water. By conducting the reactive sputtering at a frequency of 13.56 MHz and an input of 300 W, the amorphous silicon thin film 105' containing hydrogen was deposited on the semiconductor body to a thickness of 500 nm. The hydrogen content of the amorphous thin film was 15 atomic-%, and the resistivity was $5 \times 10^{13} \Omega \cdot cm$. The optical forbidden band gap was 1.95 eV, and the ratio of (peak) 2,000/(peak) 2,100 was 0.5.

Regarding the lag and after-image characteristics of the solid-state imaging device, very good characteristics as indicated in Example 1 were exhibited.

What is claimed is:

1. A light sensitive screen including at least a light-transmitting conductive film and at least one photoconductive layer, the light-transmitting conductive film being arranged with respect to the photoconductive layer at the side of intended incidence of light; said at least one photoconductive layer being formed of an amorphous silicon material which contains at least 5 atomic-% to 30 atomic-% of hydrogen, and which has an optical forbidden band gap in the range of 1.65 eV to 2.3 eV and an infrared absorption spectrum in which the peak component at the wave number 2,100 $cm^{-1}$ is not smaller than that of a wave number 2,000 $cm^{-1}$.

2. A light sensitive screen according to claim 1, wherein a hole blocking layer is interposed between the transparent conductive film and said photoconductive layer.

3. A light sensitive screen according to claim 1 or 2, wherein the transparent conductive film is disposed on a predetermined light-transmitting substrate, and a beam landing layer is disposed on a surface of said photoconductive layer opposite to said transparent conductive film.

4. A photoconductive type image pickup tube having a screen according to claim 3.

5. A light sensitive screen according to claim 1 or 2, wherein said photoconductive layer is disposed on a semiconductor substrate which has at least scanning means for sequentially selecting a plurality of photoelectric portions, said scanning means and said photoconductive layer are electronically coupled, and said light-transmitting conductive film is disposed on said photoconductive layer.

6. A light light sensitive screen according to claim 5, wherein said scanning means comprises a field effect transistor.

7. A light sensitive screen according to claim 5, wherein the semiconductor is divided into cells in which field-effect transistors are formed, and said layer of a photosensitive material is in electrical contact with electrodes of the field-effect transistors, the cells being arranged in two dimensions in correspondence with individual picture elements, and there being a common connection line for each column and each row in the two dimensional arrangement which connects in common gate electrodes of the field-effect transistors in each column for selection of the column, a common connection line which connects in common the electrodes of the field-effect transistors in each column so as to select the column and common output means connected to the common connection line of the electrodes for successively taking out electric signals from the cells corresponding to the respective picture elements.

8. A light sensitive screen according to claim 1, wherein the hydrogen-containing amorphous silicon layer is formed by a reactive sputtering process in an atmosphere containing hydrogen.

9. A light sensitive screen according to claim 8, wherein the forbidden band gap is in a range of from 1.85 eV to 2.10 eV.

10. A light sensitive screen according to claim 1, wherein said amorphous silicon material has an optical forbidden band gap in the range of 1.65 eV to 2.25 eV and an infrared absorption spectrum in which the peak component at the wave number 2,100 $cm^{-1}$ is greater than that a wave number 2,000 $cm^{-1}$.

11. A light sensitive screen according to claim 1 or claim 10, wherein said photoconductive layer formed of amorphous silicon containing hydrogen is one of a plurality of photoconductive layers.

12. A light sensitive screen according to claim 11, wherein there is a plurality of said photoconductive layers of amorphous silicon containing hydrogen and fulfilling the requirements with respect to the hydrogen percentage, optical forbidden band gap and infrared absorption spectrum.

13. A light sensitive screen according to claim 1, wherein said amorphous silicon material contains 5 atomic-% of hydrogen and has an optical forbidden band gap of 2.3 eV and an infrared absorption spectrum in which the peak component at the wave number 2,100 $cm^{-1}$ is equal to that at the wave number 2,000 $cm^{-1}$.

14. A solid-state imaging device having a screen according to claim 1, 10 or 11.

15. A light sensitive screen according to claim 10, wherein said peak at the wave number 2,000 $cm^{-1}$ is not greater than 80% of that at the wave number 2,100 $cm^{-1}$.

16. A light sensitive screen according to claim 15, wherein said peak at the wave number 2,000 $cm^{-1}$ is not greater than 50% of that at the wave number 2,100 $cm^{-1}$.

17. A light sensitive screen according to claim 15, wherein said peak at the wave number 2,000 $cm^{-1}$ is not greater than 25% of that at the wave number 2,100 $cm^{-1}$.

* * * * *